United States Patent [19]

Garrison et al.

[11] 4,147,584

[45] Apr. 3, 1979

[54] METHOD FOR PROVIDING LOW COST WAFERS FOR USE AS SUBSTRATES FOR INTEGRATED CIRCUITS

[75] Inventors: Lilburn H. Garrison, Vista, Calif.; Anant D. Dixit, Capilla Court, India

[73] Assignee: Burroughs Corporation, San Diego, Calif.

[21] Appl. No.: 864,382

[22] Filed: Dec. 27, 1977

[51] Int. Cl.² ................ H01L 21/203; H01L 21/205
[52] U.S. Cl. .................................... 156/612; 156/603; 156/613; 156/614; 156/DIG. 64; 427/86; 427/38
[58] Field of Search ............. 156/613, DIG. 64, 614, 156/603, 612; 427/86, 96, 126, 376 A, 419 A, 38

[56] References Cited

U.S. PATENT DOCUMENTS

| | | | |
|---|---|---|---|
| 3,476,617 | 11/1969 | Robinson | 148/175 |
| 3,655,439 | 4/1972 | Seiter | 148/175 |
| 3,796,597 | 3/1974 | Porter et al. | 148/175 |

OTHER PUBLICATIONS

Allison et al., Proc. of IEEE, vol. 57, No. 9, "Thin Film Si ... Applications", pp. 1490-1498 (1969).
D. J. Dunn, J. of Appl. Phys., "Elect. Prop. Si Films ... On Sapphire", vol. 38, No. 4 (1967), pp. 1909-1914.
Ajmera, J. Electrochemical Soc., Eff. ... on Silicon, Oct. 1972, pp. 1421-1424.

Primary Examiner—Michael F. Esposito
Attorney, Agent, or Firm—Mervyn L. Young; Kevin R. Peterson

[57] ABSTRACT

The method of manufacture of the present invention provides a wafer that is better than a bulk monocrystalline silicon wafer and equivalent to silicon on sapphire (SOS) wafers for use as substrates for integrated circuits. The method comprises taking an inexpensive slab of silicon having <111> crystal orientation and by low pressure CVD, high pressure CVD, or plasma deposition techniques depositing a polycrystalline layer of sapphire on the <111> silicon base. The polycrystalline layer of sapphire is then annealed at an elevated temperature to form a monocrystalline layer having a <1101> orientation. A single crystalline layer of silicon having <111> crystal orientation is then epitaxially grown on the sapphire. The resultant multilayer wafer is equivalent in function and reliability to a silicon on sapphire wafer without the commensurate cost.

7 Claims, 2 Drawing Figures

METHOD FOR PROVIDING LOW COST WAFERS FOR USE AS SUBSTRATES FOR INTEGRATED CIRCUITS

BACKGROUND OF THE INVENTION

1. Field of the Invention

The present invention relates generally to improvements in the manufacture of integrated circuit substrates and, more particularly, pertains to a process for manufacturing a multilayer wafer which can be used in place of monocrystalline bulk silicon or silicon on sapphire (SOS) as substrates for integrated circuits.

2. Description of the Prior Art

High purity monocrystalline silicon wafers and silicon on sapphire wafers are used as substrates for carriers for integrated circuit manufacturing processes. In order to obtain the high yield required from the integrated circuit manufacturing processes, the silicon semiconductor layer must be free from impurities, surface imperfection and have perfect crystalline orientation. Because of this demand for perfection, the manufacturing processes used for epitaxial deposition of silicon on sapphire or for the growth of single crystal silicon structures have become expensive procedures.

It is preferred, in some quarters, to utilize the silicon on sapphire wafers as substrates for integrated circuits because if errors are made during the integrated circuit manufacturing process, the sapphire layer may be saved by stripping off all deposited layers, including the monocrystalline silicon layer, up to the sapphire base. However, a silicon on sapphire wafer is much more expensive than a bulk monocrystalline wafer because of the cost of the sapphire ($Al_2O_3$). If bulk monocrystalline silicon wafers are utilized as substrates for integrated circuits, such material cannot be saved if the integrated circuit processing produces a low yield of the integrated circuit devices.

OBJECTS AND SUMMARY OF THE INVENTION

It is an object of the present invention to provide an inexpensive semiconductor wafer for use as a substrate for integrated circuits.

It is a further object of the present invention to provide a method for manufacturing a substrate for integrated circuits.

These objects and the general purpose of this invention are accomplished by utilizing a layer of material having a <111> crystal orientation at a desired thickness as a base or supporting layer. A polycrystalline layer of sapphire approximately 1 micron thick is deposited on the <111> crystal material by use of low pressure CVD, high pressure CVD, or plasma deposition techniques. The <111> base and its polycrystalline layer of sapphire is then annealed in a controlled inert atmosphere at elevated temperatures causing the polycrystalline sapphire to form a <1101> monocrystalline layer. An epitaxial layer of <111> silicon is then grown on the sapphire to approximatey a 2 micron thickness. The resultant three layer wafer is used as a substrate for integrated circuits in place of a bulk monocrystalline wafer or silicon on sapphire wafer.

BRIEF DESCRIPTION OF THE DRAWINGS

The exact nature of this invention, as well as other objects and advantages thereof, will be readily apparent upon consideration of the following specification related to the annexed drawings in which like reference numerals designate like parts throughout the figures thereof, and wherein.

DESCRIPTION OF THE PREFERRED EMBODIMENT

Figure 1:
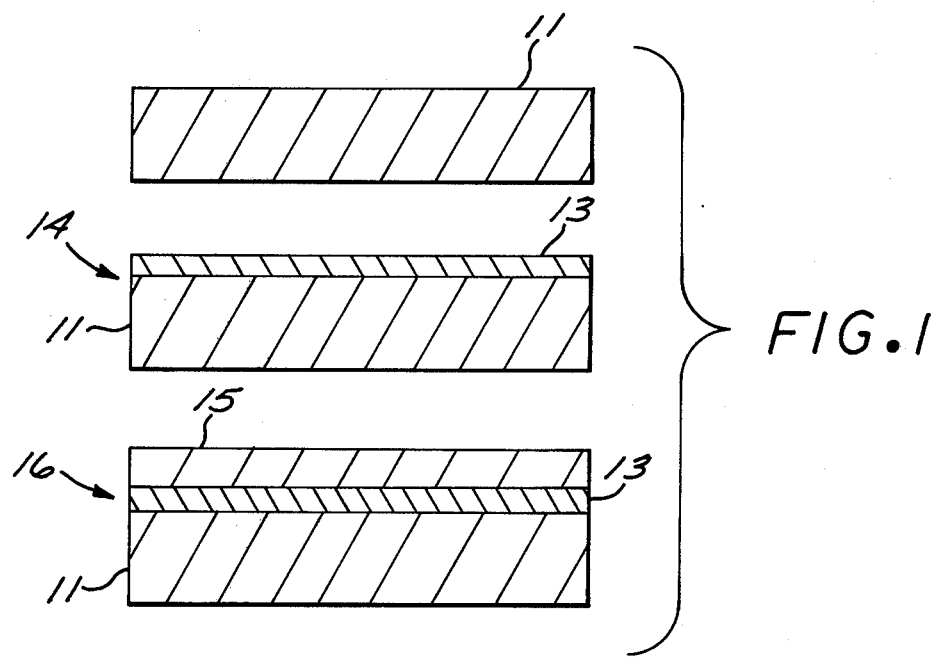
FIG. 1 is a schematic illustration indicating the layer sequence which develops during the execution of the method of the present invention.

A manufacturer of integrated circuit devices typically utilizes monocrystalline bulk silicon substrates, or substrates commonly known as silicon on sapphire (SOS). For an example of how such substrates are utilized in the manufacture of integrated circuit devices, reference can be had to U.S. Pat. No. 3,974,003 issued Aug. 10, 1966 to Zirinsky, et al.

Between the bulk monocrystalline silicon substrate and the silicon on sapphire substrate, the silicon on sapphire substrate is preferred for the reason that if the process for generating the integrated circuit devices on the SOS substrates produces a low yield, the sapphire layer can be saved and reused by simply stripping the other deposited layers away. However, the silicon on sapphire substrate is not used to the extent that the bulk silicon substrate is utilized because of the high cost of the sapphire crystalline material.

The expitaxial growth of silicon on a sapphire crystalline body is well known. A variety of processes are known to provide epitaxial deposition of silicon on a sapphire body. For example, consider the process taught by Robinson, et al., in U.S. Pat. No. 3,413,145 issued Nov. 26, 1968, and the process taught by Corboy, et al., in U.S. Pat. No. 3,885,061 issued May 20, 1975. As was noted earlier, however, such a manufacturing process is expensive. Even though the silicon on sapphire substrate produced is high quality and highly desirable for use as substrates for integrated circuits, because of their cost, they have not been utilized to the extent that bulk monocrystalline silicon wafers are used.

Accordingly, the method of the present invention provides a substitute for an SOS substrate, which is as cheap as, or cheaper, than the bulk monocrystalline silicon wafer while providing all the advantages of the SOS wafer. The method of the present invention provides a substrate which can be called a silicon on sapphire on silicon substrate ([SO]²S).

By utilizing a base layer of silicon instead of sapphire, the cost of the substrate is considerably reduced. The only requirement of the base layer is its crystal lattice orientation. It can be very inexpensive, faulty silicon structure full of impurities, etc., because it will be insulated from the top layer of silicon, which is of the desired purity, crystal orientation and crystal perfection by a layer of insulating sapphire ($Al_2O_3$). If an integrated circuit manufacturing process utilizing this trilayer wafer as a substrate provides a low yield, the inexpensive base layer of silicon and the sapphire layer thereon can be reused by simply stripping the entire integrated circuit device down to the sapphire layer in the same way that the sapphire base can be reused in an SOS device.

Processes are known for producing multiple layer structures which consist of a silicon-monocrystalline base, an insulating layer and a silicon epitaxial layer. However, the highly desirable silicon on sapphire on silicon tri-level substrate manufactured according to the present method heretofore has not been available. For an example of a tri-level substrate which consists of a monocrystalline silicon base, insulating layer and a silicon epitaxial layer, reference should be made to U.S. Pat. No. 3,655,439 issued to Seiter on Apr. 11, 1972. As is evident from the Seiter patent, the silicon crystal base utilizes a <100> orientation. It must first be etched by a hydrofluoric, nitric acid mixture before the insulating layer is deposited thereon. The insulating layer of magnesium aluminum spinel is deposited by depositing an amorphous oxide layer, approximately half a micron thick, which is annealed at a temperature of 950° C., causing it, over a period of four hours, to recrystallize into a spinel structure having the composition MgO:Al$_2$O$_3$=1:1. An epitactic silicon layer is then precipitated upon the spinel layer.

The present invention does not utilize a spinel insulating layer between the silicon base and the top epitaxial silicon layer. It utilizes a one micron thick monocrystalline sapphire layer. Polycrystalline sapphire is first deposited on the silicon base by means of a high gas flow CVD reactor technique, or a reduced pressure CVD reactor technique, or by a plasma reactor technique.

The reactors that may be used for the deposition of the polycrystalline sapphire on the silicon base are well known in the art. For example, an apparatus known as an epitaxial reactor system, manufactured by Applied Materials, Inc., identified as Series 7000, may be used to practice the deposition of polycrystalline sapphire on a silicon substrate at high gas flow rates. The same company makes a plasma reactor known as the Amp-3300, which may be utilized to deposit a polycrystalline sapphire layer on the substrate by plasma deposition techniques. Applied Materials, Inc. also manufactures a low pressure CVD reactor which can be used to practice the present invention.

The polycrystalline sapphire is then annealed in a controlled inert atmosphere such as nitrogen, for example, at an elevated temperature of about 1000°-1300° C. for 4-8 hours to convert the polycrystalline sapphire layer to a monocrystalline layer.

Figure 2:
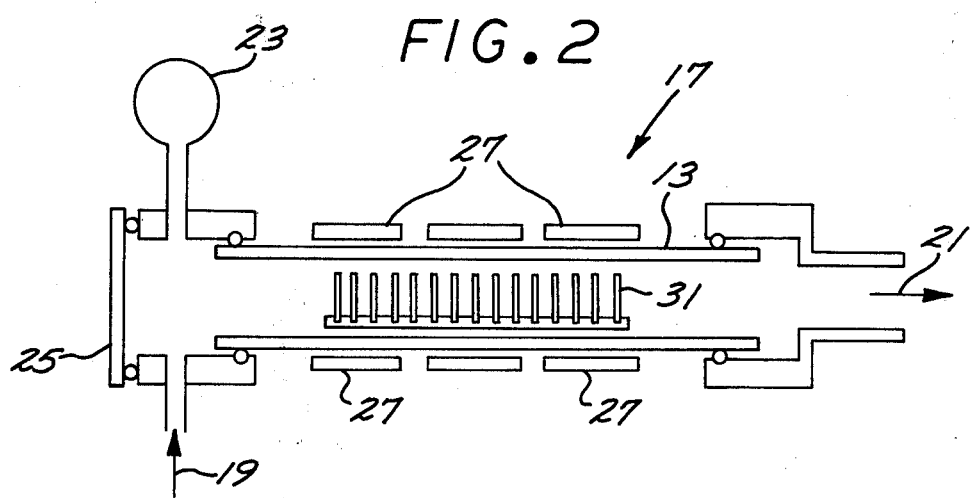
FIG. 2 is a diagrammatic illustration of a chemical vapor deposition (CVD) reactor which may be used to practice the method of the present invention.

Referring now to FIG. 1, a silicon supporting body 11 having an orientation of <111> and a thickness of 15 mils or higher depending on application, is placed in a reactor such as shown in FIG. 2, for example. The silicon is preferably the inexpensive kind having impurities and surface imperfections therein. A one micron layer of polycrystalline sapphire (Al$_2$O$_3$) is deposited on the silicon body 11 by chemical vapor or plasma deposition techniques, in the reactor of FIG. 2, for example. The sapphire layer 13 is formed into a monocrystalline sapphire insulating layer having an orientation of <1101> by annealing in a controlled inert atmosphere at an elevated temperature. The monocrystalline sapphire on silicon wafer 14 is then placed in a well known reactor system for epitaxial growth of a two micron layer 15 or pure monocrystalline silicon having the desired crystalline perfection and purity, and an orientation of <111>.

The resulting tri-level wafer 16 is then utilized as a substrate for integrated circuits. It provides the same advantages and performance of the well known, but much more expensive silicon on sapphire wafers. The advantage of the tri-level substrate 16 is that the supporting body 11 can be any crystalline material having a <111> orientation. Thus, the cheapest material available can be utilized. At present, this is an imperfect silicon body. However, other materials, such as germanium or galium arsenide, for exammple, also have <111> orientation and are equally suitable for the body layer 11 of a substrate 16. When germanium or galium arsenide or other materials having the <111> orientation are used, the annealing temperature and time will vary depending on the material used.

Referring now to FIG. 2, an exemplary low pressure CVD reactor such as manufactured by Applied Materials, Inc., is illustrated. The method of the present invention for manufacturing the substrate 16 can be practiced by use of this reactor and a high temperature controlled atmosphere furnace, as is well known in the art. The reactor 17 has a tubular body portion 33, which is surrounded by a plurality of zone resistance heater elements 27 to bring the temperature within the tubular body portion 33, and the temperature of the wafers 31 placed therein to the desired deposition temperature. At one end 25 of the reactor 17 a gas inlet 19 provides for injection of the carrier gas and aluminum oxide containing gases. A pressure sensor device 23 indicates the operating pressure within the body. A load and unload cap 25 provides for access to the interior of the reactor body 33. The other end of the reactor is connected to a vacuum pump (not shown), for example, to create gas flow from the inlet 19 to the exhaust 21.

According to the method of the present invention, wafers 31 of inexpensive and imperfect monocrystalline silicon are placed within the reactor 17. The atmospheric gases within it are removed by the vacuum pump at the exhaust end 21. The entire reactor is purged by the carrier gas, such as hydrogen, for example, which is provided at the preferred rate of 600 cc per minute. The wafers 31 within the reactor 17 are then heated to a temperature within the preferred range of 250°-350° C. After the wafers are at this temperature, a source of sapphire, such as trimethyl aluminum, is injected at the inlet 19 at a rate of 40-80 cc per minute. The pressure within the reactor is preferably maintained with the range of 0.5 to 0.9 torr. These conditions are maintained until approximately a one micron thick layer 13 of the polycrystalline sapphire is deposited on the silicon wafers 31.

The wafers with the polycrystalline layer of sapphire thereon are then placed in a high temperature controlled atmosphere furnace of an inert gas such as nitrogen, for example. The wafers are annealed at a temperature of from 1100° C. to 1300° C. in this inert atmosphere from 4 to 8 hours until the polycrystalline sapphire layers are converted into layers of <1101> monocrystalline sapphire.

It is critical that the silicon body wafers 31 have a —<111> orientation because this will produce a <1101> orientation of monocrystalline sapphire which is required in order for the epitaxial growth of pure silicon on the sapphire layer 13 to have a <111> orientation. Only a <1101> single crystalline sapphire layer will provide a <111> silicon epitaxial growth.

Upon the completion of the deposition and annealing of a monocrystalline sapphire layer 13 on the silicon body 11, the same reactor (FIG. 2) may be utilized for epitaxial deposition of a monocrystalline silicon layer 15 on the sapphire layer 13. This may be done, for example, by heating the reactor 17 to a range of 1000°-1250° C. at approximately atmospheric pressure and following the equilibrium equation:

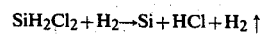

$$SiH_2Cl_2 + H_2 \rightarrow Si + HCl + H_2 \uparrow$$

The silicon will be deposited in the well known epitaxial manner. Other sources of silicon may also be used with equal effectiveness as is well known in the art.

What has been described is a method for producing an inexpensive semiconductor wafer for use as a substrate for integrated circuits. It should be understood, however, that the foregoing disclosure relates to a preferred embodiment of the invention in that modifications may be made therein without departing from the spirit and scope of the invention as set forth in the appended claims.

What is claimed is:

1. A method for manufacturing wafers for use as substrates for integrated circuits, which wafers have a minimum of crystal defects, said method comprising:
   depositing a polycrystalline layer of pure sapphire upon a crystalline body having <111> orientation;
   annealing the polycrystalline layer of pure sapphire sufficiently to form a monocrystalline layer of pure sapphire, said monocrystalline sapphire layer having <1101> orientation; and
   depositing an epitactic monocrystalline layer of silicon upon the layer of monocrystalline pure sapphire, said epitactic monocrystalline silicon layer having a <111> orientation.

2. The method of claim 1 wherein the layer of sapphire is deposited to a thickness of 1 micron.

3. The method of claim 2 wherein the layer of silicon deposited on the layer of sapphire is deposited to a thickness of 2 microns.

4. The method of claim 1 wherein the step of depositing sapphire upon a crystalline body having <111> orientation is accomplished by using a CVD high gas flow reactor.

5. The method of claim 1 wherein the step of depositing sapphire upon a crystalline body having <111> orientation is accomplished by using a plasma reactor.

6. The method of claim 1 wherein the step of depositing sapphire upon a crystalline body having <111> orientation is accomplished by using a low pressure reactor.

7. The method of claim 1 wherein the step of depositing sapphire upon a crystalline body having <111> orientation, comprises:
   placing the <111> crystalline body in a controlled atmosphere environment having a pressure range of 0.5–0.9 torr;
   heating the <111> crystalline body within said controlled environment to a temperature within the range 250°–350° C., inclusive;
   flowing an inert carrier gas, such as hydrogen, through said controlled environment at a rate of approximately 600 cc/min.; and
   flowing trimethyl aluminum through said controlled environment at a rate within the range 40–80 cc/min., inclusive,
and wherein the step of annealing comprises:
   placing the <111> crystalline body with the polycrystalline layer of sapphire deposited therein in a controlled atmosphere environment of inert gas, such as nitrogen;
   heating the environment to a temperature within the range 1100°–1300° C., inclusive; and
   leaving the <111> crystalline body with the polycrystalline layer of sapphire therein in the heated environment from 4 to 8 hours, until the polycrystalline layer is converted to a monocrystalline layer.

* * * * *